(12) United States Patent
Cheng et al.

(10) Patent No.: US 7,732,244 B2
(45) Date of Patent: Jun. 8, 2010

(54) METHOD FOR FORMING LIGHT-TRANSMITTING REGIONS

(75) Inventors: Chieh-Yuan Cheng, Hsinchu (TW); Tzu-Han Lin, Hsinchu (TW); Pai-Chun Peter Zung, Hsinchu (TW)

(73) Assignee: VisEra Technologies Company Limited, Hsinchu (TW)

( * ) Notice: Subject to any disclaimer, the term of this patent is extended or adjusted under 35 U.S.C. 154(b) by 262 days.

(21) Appl. No.: 12/003,186

(22) Filed: Dec. 20, 2007

(65) Prior Publication Data

US 2009/0162967 A1  Jun. 25, 2009

(51) Int. Cl.
*H01L 21/00* (2006.01)

(52) U.S. Cl. .............................. 438/69; 438/54; 438/72; 257/E21.122

(58) Field of Classification Search .................... 438/54, 438/57, 69, 71, 72, 456, 798, 799; 250/492.2; 257/431–436, E31.11, E31.117, E31.121, 257/E31.122, E31.127, E21.6; 118/56, 620, 118/639, 642
See application file for complete search history.

(56) References Cited

U.S. PATENT DOCUMENTS 5,835,274 A * 11/1998 Baek ........................ 359/619

| | | | |
|---|---|---|---|
| 2001/0019765 A1 | 9/2001 | Kiuchi et al. | |
| 2008/0283730 A1* | 11/2008 | Hartlove et al. | 250/208.1 |
| 2008/0291303 A1* | 11/2008 | Onozawa et al. | 348/294 |
| 2008/0293180 A1* | 11/2008 | Mouli | 438/69 |
| 2009/0002818 A1* | 1/2009 | Iwabu et al. | 359/457 |

FOREIGN PATENT DOCUMENTS

WO  WO99/13157  3/1999

* cited by examiner

*Primary Examiner*—Matthew C Landau
*Assistant Examiner*—Joseph C Nicely
(74) *Attorney, Agent, or Firm*—Muncy, Geissler, Olds, & Lowe, PLLC

(57) ABSTRACT

A method for forming a light-transmitting region comprises providing a support feature. A sacrificial layer is formed over a portion of the support feature, wherein the sacrificial layer comprises an energy-induced swelling material. A light-blocking layer is conformably formed over the support feature to cover the sacrificial layer and the support feature. The support feature, the sacrificial layer, and the light-blocking layer are subjected to an energy source to swell the sacrificial layer until bursting to thereby delaminate a portion of the light-blocking layer from the support feature and leave a light-transmitting region exposed with a portion of the support feature in the light-blocking layer. A gas flow or scrub cleaning force is provided to clean up the light-transmitting region and a top surface of the light-blocking layer remains over the support feature.

20 Claims, 11 Drawing Sheets

METHOD FOR FORMING LIGHT-TRANSMITTING REGIONS

BACKGROUND OF THE INVENTION

1. Field of the Invention

The invention relates to image sensing device fabrication, and in particularly to methods for forming a light-transmitting region of an image sensing device.

2. Description of the Related Art

Recently, image sensing devices such as solid state image sensing devices are being used in a very wide range of optoelectronic devices including, for example, digital cameras, cellular phones, and toys. Conventional image sensing devices include image sensors such as charge coupled device (CCD) image sensors and complementary metal oxide semiconductor (CMOS) image sensors.

In the art of solid state imaging devices, microlenses are typically provided to improve image sensitivity. In addition, a diaphragm is typically provided within the solid state imaging device as a light path filter of the microlenses, to therby regulate the amount of light that passes through the microlenses and toward the image sensors therein.

The diaphragm is typically defined over a top surface of the microlenses by forming a patterned light-blocking layer by photolithgraphy techniques over the top surface of the microlenses. Since the microlenses are typically provided with a curved surface, photolithgraphy techniques performed to the portion of the light-blocking layer formed over the curved surface of the microlenses may result in uneven exposure uniformalty and repeatablity during patterning thereof. Moreover, the use of photolithgraphy techniques also have disadvantages of increasing fabrication costs and time.

BRIEF SUMMARY OF THE INVENTION

Therefore, the invention provides methods for forming a light-transmitting region of an image sensing device in a more economical way.

An exemplary embodiment of a method for forming a light-transmitting region comprises providing a support feature. A sacrificial layer is formed over a portion of the support feature, wherein the sacrificial layer comprises an energy-induced swelling material. A light-blocking layer is conformably formed over the support feature to cover the sacrificial layer and the support feature. The support feature, the sacrificial layer, and the light-blocking layer are subjected to an energy source to swell the sacrificial layer until bursting to thereby delaminate a portion of the light-blocking layer from the support feature and leaving a light-transmitting region exposed with a portion of the support feature in the light-blocking layer. A gas flow or scrub cleaning force is provided to clean up the light-transmitting region and a top surface of the light-blocking layer remaining over the support feature.

An exemplary embodiment of a method for forming an image sensing device comprises providing an image sensing structure with an upposmost microlens, wherein the microlens is formed with a curved portion. A sacrificial layer is formed over a portion of the curved portion of the microlens, wherein the sacrificial layer comprises an energy-induced swelling material. A light-blocking layer is conformably formed over the image sensing structure, covering the sacrificial layer and the microlens. The image sensing structure, the sacrificial layer, and the light-blocking layer are subjected to an energy source to swell up the sacrificial layer until bursting to thereby delaminate a portion of the light-blocking layer from the microlens and leaving a light-transmitting region in the light-blocking layer, thereby defining a diaphragm for the microlens. A gas flow or scrub cleaning force is provided to clean up the diaphragm and a top surface of the light-blocking layer remaining over the image sensing structure. A planar substrate is disposed over the image sensing structure with the diaphragm for the microlens formed thereon, wherein the planar substrate is transparent to light.

Another exemplary embodiment of a method for forming an image sensing device comprises providing a planar substrate, wherein the planar substrate is transparent to light. A sacrificial layer is formed over a portion of the planar substrate, wherein the sacrificial layer comprises an energy-induced swelling material. A light-blocking layer is conformably formed over the planar substrate to cover the sacrificial layer and the planar substrate. The planar substrate, the sacrificial layer, and the light-blocking layer are subjected to an energy source to swell the sacrificial layer until bursting to thereby delaminate a portion of the light-blocking layer from the planar substrate and leaving a light-transmitting region in the light-blocking layer, wherein the light-transmitting region exposes a portion of the planar substrate. A gas flow or scrub cleaning force is provided to clean up the light-transmitting region and a top surface of the light-blocking layer remaining over the transparent substrate. The planar substrate with a light-transmitting region in the light-blocking layer formed thereon is disposed over an image sensing structure with an upposmost microlens and the light-transmitting region defined as a diaphragm for the microlens.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
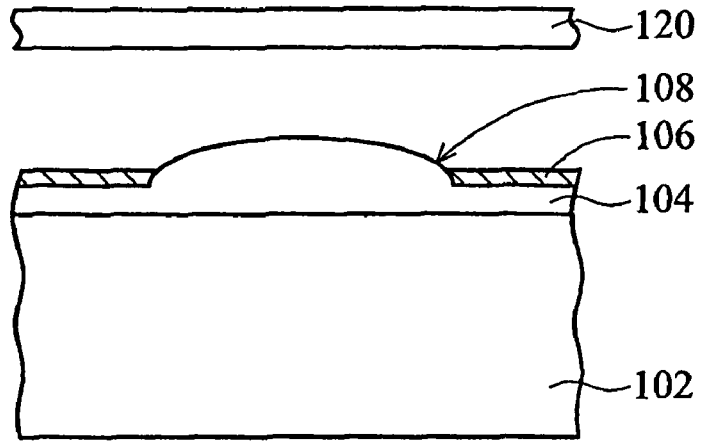
FIGS. 1 and 2 are schematic cross sections showing a part of an image sensing device according to various embodiments of the invention, respectively.
Figure 2:
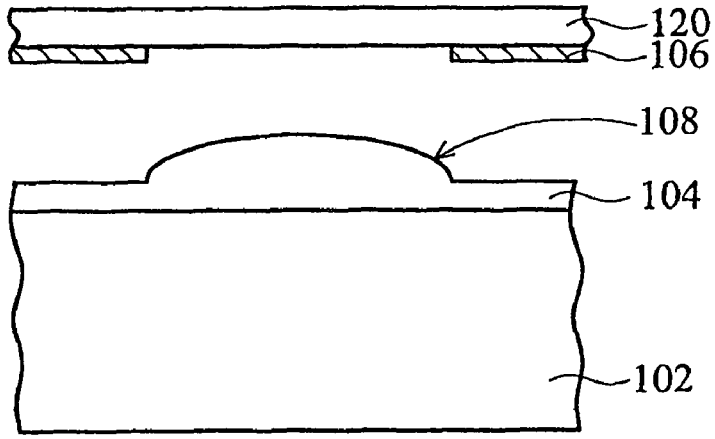

FIGS. 1 and 2 are schemhatic cross sections showing a part of an image sensing device according to various embodiments of the invention, respectively.

As shown in FIG. 1, an exemplary image sensing device 100 is illustrated, including an image sensing structure 102, a microlens 104, a light-blocking layer 106 and a transparent substrate 120. In FIG. 1, the image sensing structure 102 is illustrated as a planar structure and may include image sensors (not shown) such as charge-coupled device (CCD) image sensors, complimentary metal oxide semiconductor (CMOS) image sensors or the like, a color filter layer (not shown) comprising different color filters (e.g. red, green and blue light color filters), a plurality of interconnecting metal layers (not shown), and a plurality of intermetal dielectric layers (not shown) for insulating the interconnecting metal layers. For the purpose of simplicity, the above functional features in the image sensing structure 102 are not illustrated in FIG. 1 in detail and only the image sensing structure 102 with a planar surface is illustrated.

Referring to the FIG. 1, the microlens 104 is disposed over the image sensing structure 102 and the light-blocking layer 106 is further patterned and formed over portions the microlens 104, thereby exposing a portion of a curved surface 108 of the microlens 104. The light-blocking layer 106 is formed of opaque material allowing no transmittance of incidental light passing therethrough and the portion of the microlens 104 exposed by the light-blocking layer 106 thereby defines a diaphragm D for the image sensors (not shown) disposed in the underlying image sensing structure 102. The transparent substrate 120 may be, for example, a glass substrate disposed over the microlens 104 and the light-blocking layer 106 and supported by, for example, a plurality of spacers (not shown) formed over the image sensing structure 102. Incidental light (not shown) can thus travel through the transparent substrate 120 and an amount of incidental light passing through the microlens 104 and toward the image sensors in the image sensing structure 102 can thus be regulated by the diaphragm D.

FIG. 2 shows another exemplary image sensing device 100' similar with the device illustrated in FIG. 1, with the only differences therebetween, the light-blocking layer 106 is patterned and formed over the transparent substrate 120 to thereby define a diaphragm D for the image sensing features (not shown) formed in the underlying image sensing structure 102.

Figure 3:
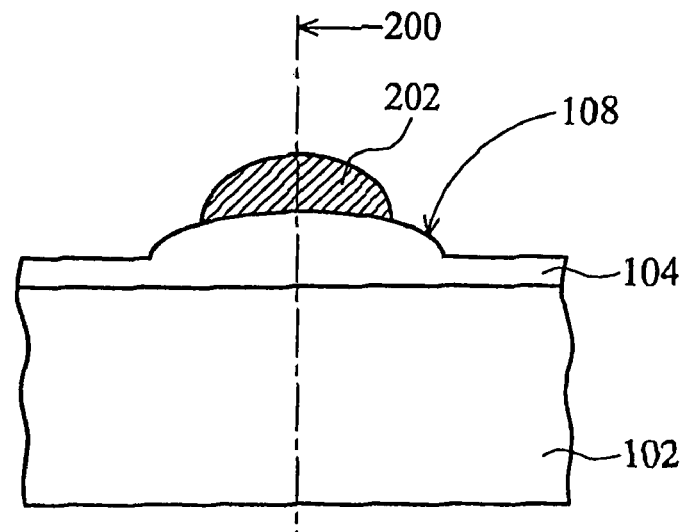
FIGS. 3, 5, 7, 8, and 10 are schematic cross sections showing various fabrication steps according to an embodiment of a method for forming a light-transmitting region of the invention.
Figure 4:
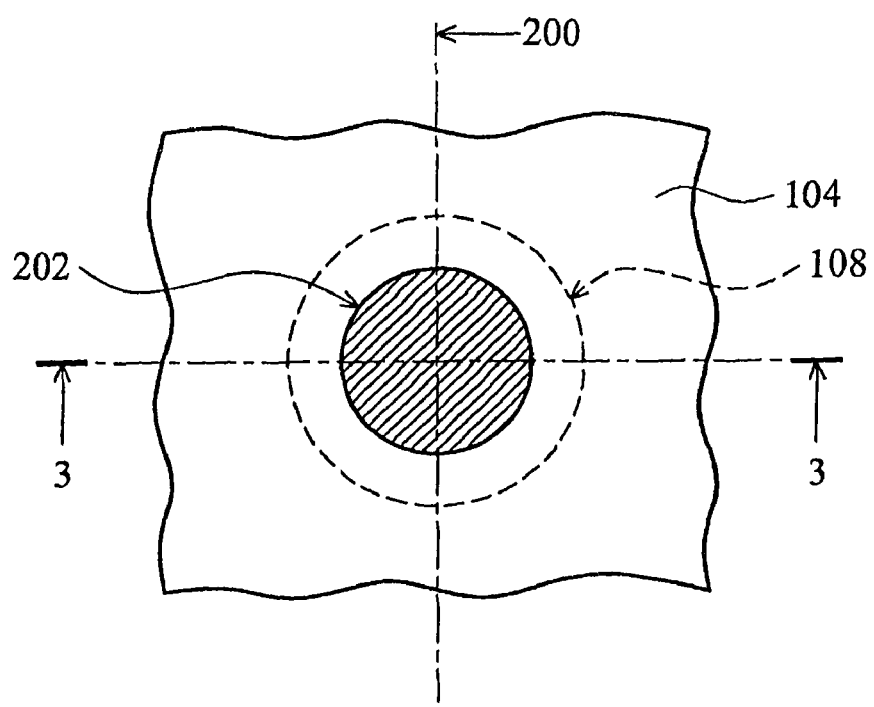
FIG. 4 is a schematic diagram showing a top view along line 3-3 of FIG. 3.
Figure 5:
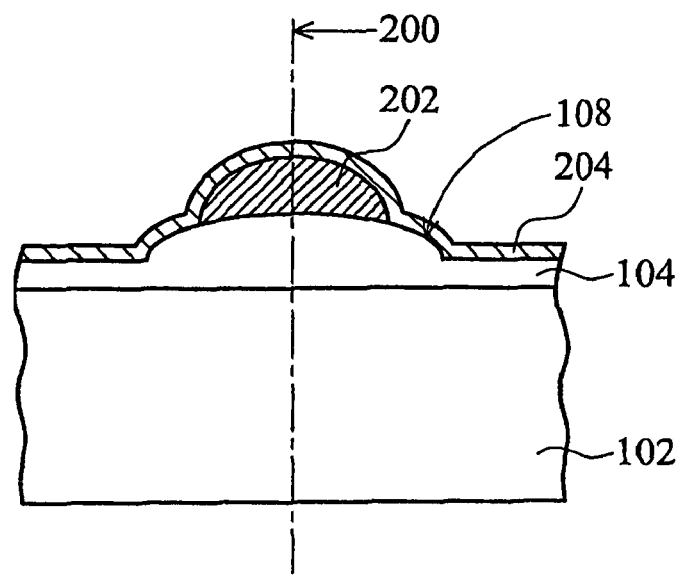
Figure 6:
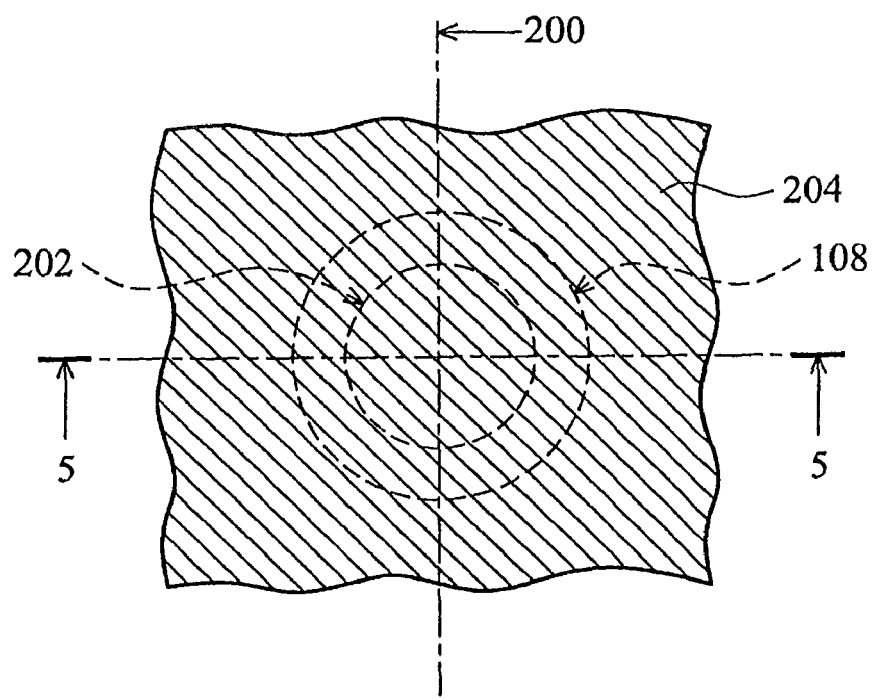
FIG. 6 is a schematic diagram showing a top view along line 5-5 of FIG. 5.
Figure 7:
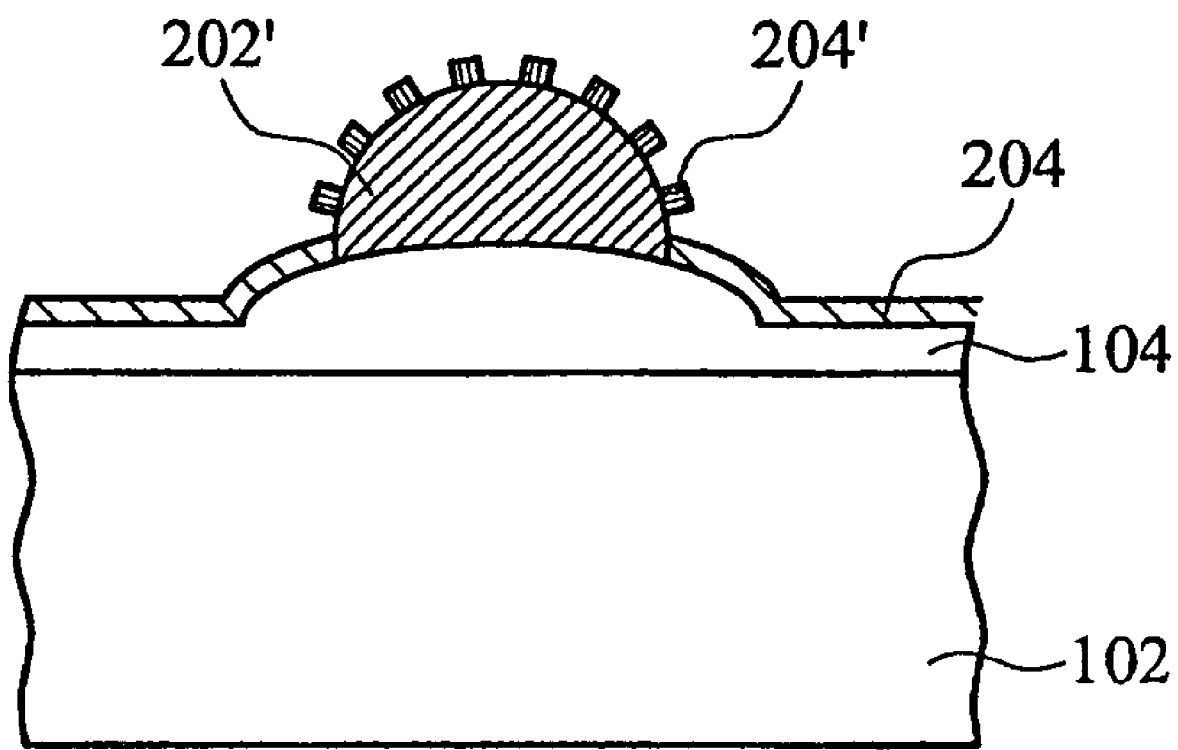
Figure 8:
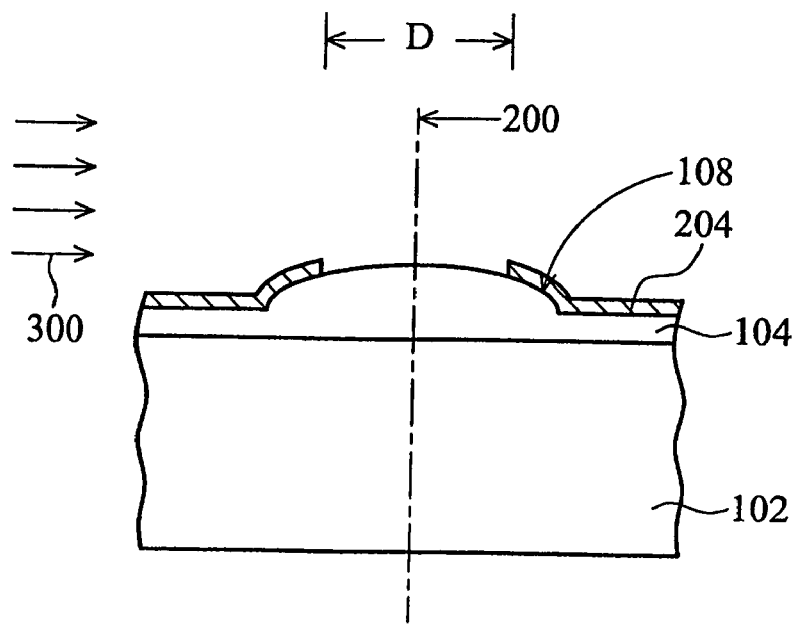
Figure 9:
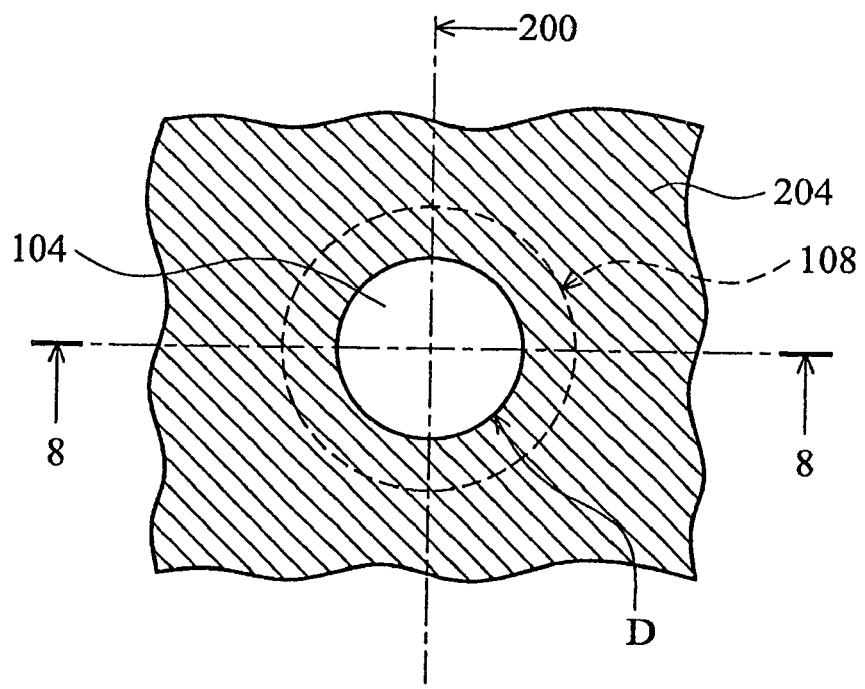
FIG. 9 is a schematic diagram showing a top view along line 8-8 of FIG. 8.

FIGS. 3-10 are schematic diagrams showing various fabrication steps of an exemplary method for forming a light-transmitting region, wherein FIGS. 3, 5, 7, 8, and 10 are schematic cross sections and FIGS. 4, 6 and 9 are schematic top views.

In FIGS. 3 and 4, the image sensing structure 102 with the microlens 104 formed thereon is first provided as a support feature. The microlens 104 is provided with a curved surface 108. Next, a sacrificial layer 202 is formed over a portion of the curved surface 108 of the microlens 104. The sacrificial layer 202 can be formed over the microlens 104 by, for example, a liquid dispenser such as a gel dispenser, thereby forming a liquid drop and then solidifying. Example of liquid dispensers can be a commercial high precision dispenser or electrical printing machine.

The sacrificial layer 202 may comprise energy-induced swelling material such as a chemical foaming agent or a physical foaming agent. The chemical foaming agent, for example may comprise azobisformamide (ABFA), azodicarbonamide (ADCA), p,p'-oxybis(benzenesulfonyl hydrazide) (OBSH), or N, N'-dinitrosopentamethylenetetramine (DPT), and the physical foaming agent may comprise, for example, $C_2H_4Cl_2$, Freon or the like. The sacrificial layer 202 is thus formed in a substantially semispherical shape (see FIG. 3) and can be substantially aligned to a central axis 200 of the microlens 104 through an alignment function of the liquid dispenser. The energy-induced swelling material of the sacrificial layer 202 allows swelling from its original volume to a larger volume and may finally burst while subjected thereof to an energy source such as a thermal energy.

FIG. 4 illustrates a top view taken along line 3-3 therein, showing substantially circular top views of the sacrificial layer 202 and the microlens 104. The sacrificial layer 202 substantially overlies a curved surface 108 of the microlens 104 and shows a substantially homocentric placement therebetween without much deviation. Therefore, the sacrificial layer 202 is substantially aligned to one of the central axis 200 of the microlens 104.

In FIGS. 5 and 6, a light-blocking layer 204 is conformably formed over the structure illustrated in FIGS. 3 and 4, thereby covering the sacrificial layer 202 and the microlens 104. The light-blocking layer 204 may be formed by, for example, sputtering methods and may comprise opaque materials such as metal, allowing no transmittance of incidental light to pass therethrough. The light-blocking layer 204 may have a thickness of about 0.1 μm~1.0 μm.

Next, the structure illustrated in FIGS. 5 and 6 are subjected to an energy source such as a thermal energy source performed by a rapid thermal process (RTP) or a furnace thermal process to induce the material of the sacrificial layer 202 to swell from its original volume and form the swelled sacrificial layer 202' as shown in FIG. 7. During swelling of the sacrificial layer 202, the portion of the light-blocking layer 204 overlying the sacrificial layer 202 illustrated in FIGS. 5 and 6 is delaminated from the portion thereof that overly the microlens 104 and are thus broken in several fragments 204'. The energy subjected to the sacrificial layer 202 provided until the swelled sacrificial layer 202 bursts and thus the portion of the light-blocking layer 204 overlying the sacrificial layer 202 delaminates from the curved surface 108 of the microlens 104.

In FIGS. 8 and 9, a gas flow or scrub cleaning force 300 is next provided to clean the surface of the structure illustrated in FIG. 7 after the swelled sacrificial layer 202' bursts. After cleaning of the gas flow/scrub cleaning 300, a patterned light-blocking layer 204 is left over the microlens 104 and exposes a portion of the curved surface 108 of the microlens 104 previously covered by the sacrificial layer 202, thereby forming a light-transmitting region D over the microlens 104 as a diaphragm. As shown in FIG. 9, the light-transmitting region D is still substantially aligned to a central axis 202 of the underlying microlens 204. A plurality of spacers (not shown) and the transparent substrate 120 can be further provided over the microlens 104 illustrated in FIGS. 8 and 9 and the transparent substrate 120 can thus be structurally support by the spacers. Thus, an improved image sensing device 100" is fabricated.

Through illustration of the embodiments of the invention above, the light-transmitting region D can be formed by a method other than traditional photolithography techniques. As such, the embodiments of the invention provide a cost-effective and time-saving way for patterning a light-blocking layer 204 in the image sensing device 100" and forming a diaphragm for the underlying image sensing elements (not shown). A relatively precise alignment between the curved surface 108 of the microlens 104 and the diaphragm D can be also obtained.

Figure 11:
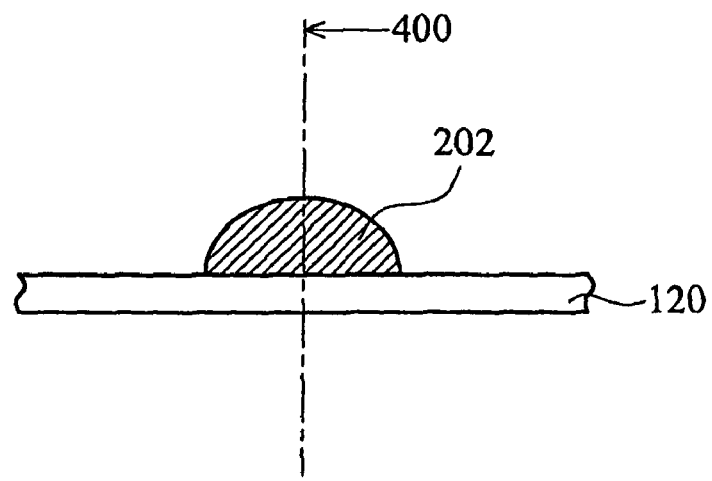
FIGS. 11, 13, 15, 16, and 18 are schematic cross sections showing various fabrication steps according to another embodiment of a method for forming a light-transmitting region of the invention.
Figure 12:
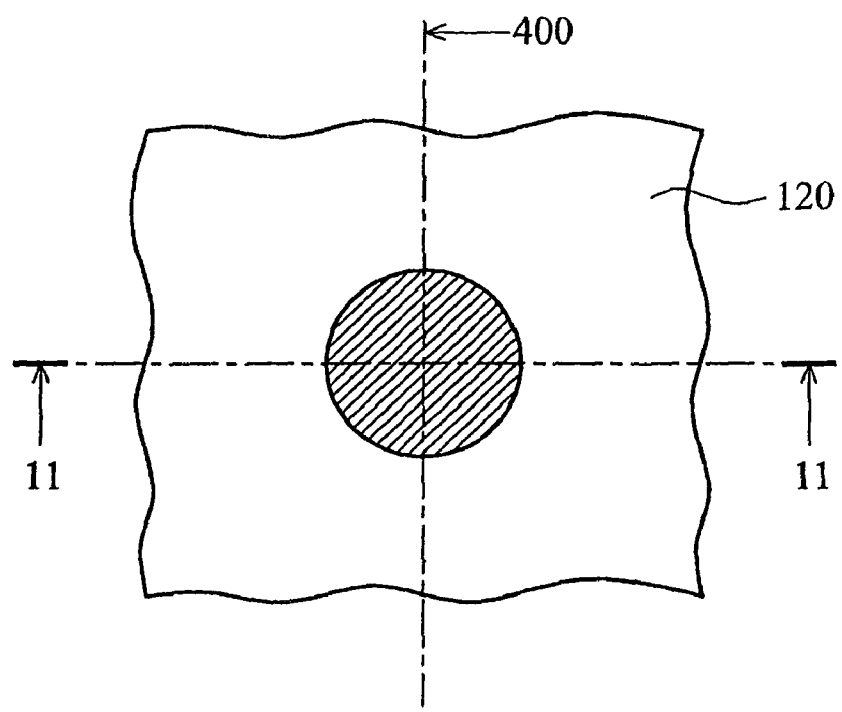
FIG. 12 is a schematic diagram showing a top view along line 11-11 of FIG. 11.
Figure 13:
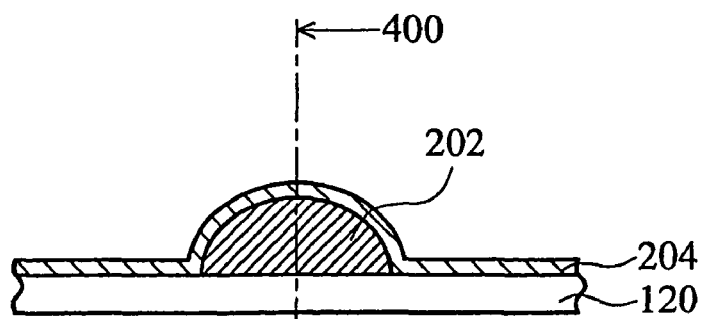
Figure 14:
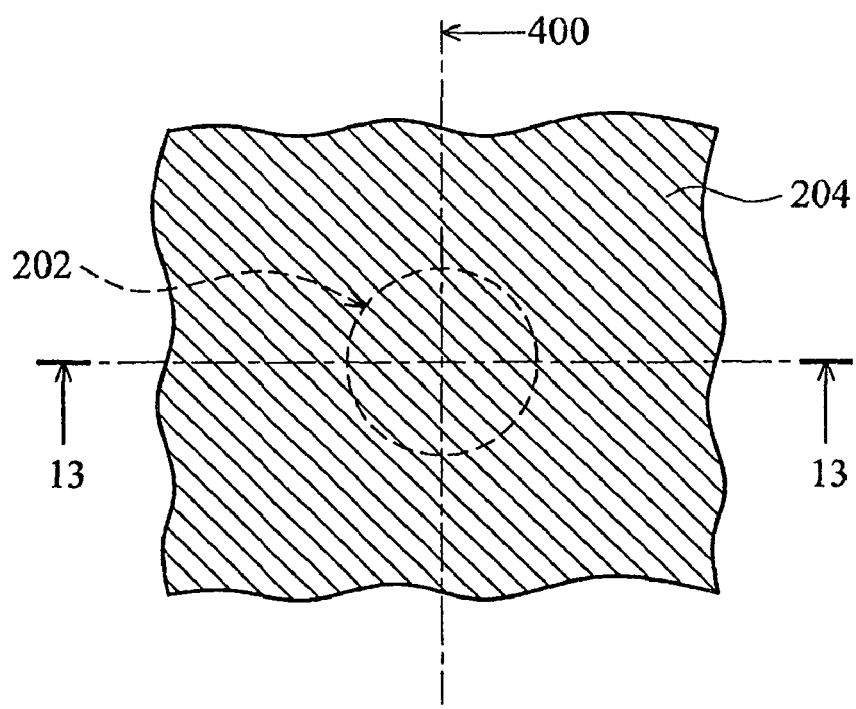
FIG. 14 is a schematic diagram showing a top view along line 13-13 of FIG. 13.
Figure 15:
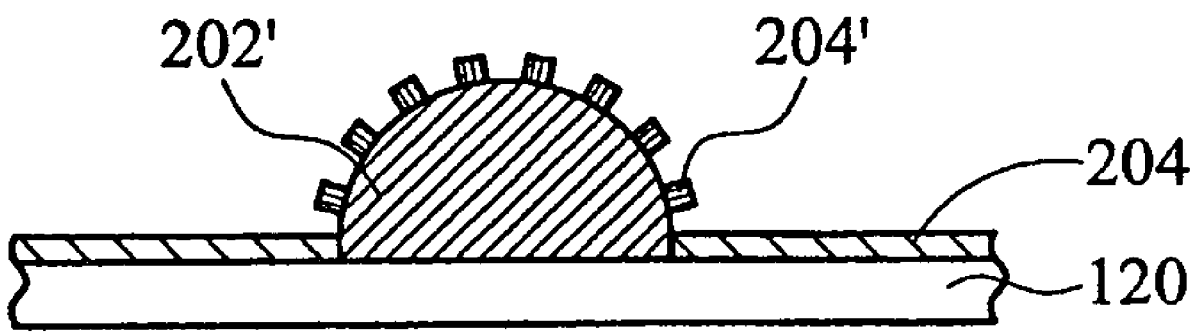
Figure 16:
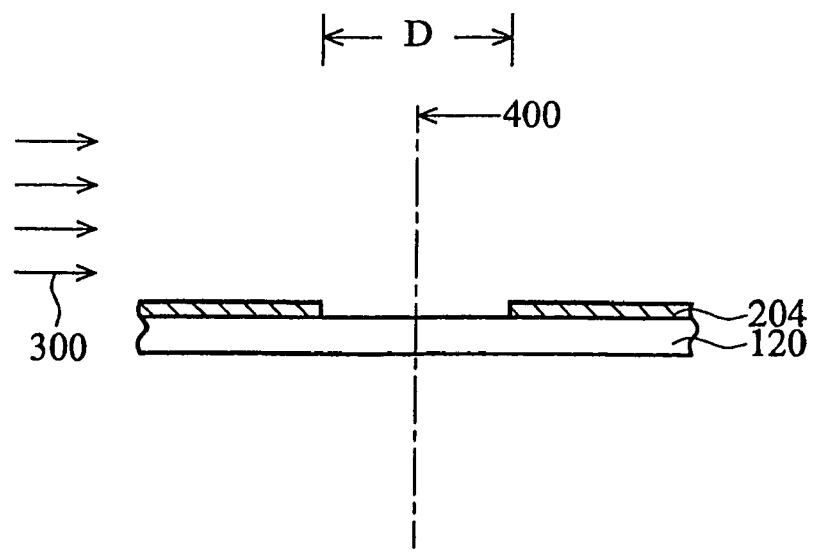
Figure 17:
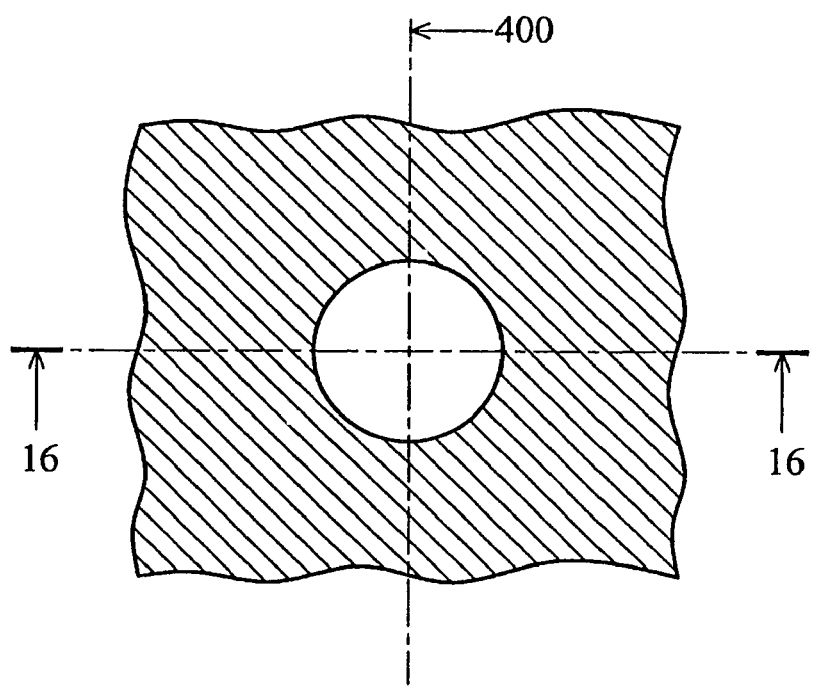
FIG. 17 is a schematic diagram showing a top view along line 16-16 of FIG. 16.

FIGS. 11-17 are schematic diagrams showing various fabrication steps of an exemplary method for forming a light-transmitting region, wherein FIGS. 11, 13, 15, 16, and 18 are schematic cross sections and FIGS. 12, 14 and 17 are schematic top views.

In FIGS. 11 and 12, the transparent substrate 120 with a planar surface is first provided, as a support feature. Next, a sacrificial layer 202 is formed over the transparent substrate 120. The sacrificial layer 202 can be formed over the transparent substrate 120 by, for example, a liquid dispenser such as a gel dispenser, thereby forming as a liquid drop and then solidifying. Example of liquid dispenser can be a commercial high precision dispenser or electrical printing machine.

The sacrificial layer 202 may comprise energy-induced swelling material such as a chemical foaming agent or a physical foaming agent. The chemical foaming agent, for example may comprise azobisformamide (ABFA), azodicarbonamide (ADCA), p,p'-oxybis(benzenesulfonyl hydrazide) (OBSH), or N, N'-dinitrosopentamethylenetetramine (DPT), and the physical foaming agent may comprise, for example, $C_2H_4Cl_2$, Freon or the like. The sacrificial layer 202 is thus formed in a substantially semispherical shape (see FIG. 11) and has a central axis 400. The energy-induced swelling material of the sacrificial layer 202 allows swelling from its original volume to a larger volume and may finally burst while subjected thereof to an energy source such as a thermal energy. FIG. 12 illustrates a top view taken along line 11-11 therein, showing a substantially circular top views of the sacrificial layer 202 over the transparent substrate 120.

In FIGS. 13 and 14, a light-blocking layer 204 is conformably formed over the structure illustrated in FIGS. 11 and 12, thereby covering the sacrificial layer 202 and the transparent substrate 120. The light-blocking layer 204 may be formed by, for example, sputtering methods and may comprise opaque materials such as metal, allowing no transmittance of incidental light to pass therethrough. The light-blocking layer 204 may have a thickness of about 0.1~1.0 um.

Next, the structure illustrated in FIGS. 13 and 14 are subjected to an energy source such as a thermal energy source performed by a rapid thermal process (RTP) or a furnace thermal process to induce the material of the sacrificial layer 202 to swell from its original volume and form the swelled sacrificial layer 202' shown in FIG. 15. During swelling of the sacrificial layer 202, the portion of the light-blocking layer 204 overlying the sacrificial layer 202 illustrated in FIGS. 13 and 14 is delaminated from the portion thereof overlying the transparent substrate 120 and thus broken in several fragments 204'. The energy subjected to the sacrificial layer 202 is provided until the swelled sacrificial layer 202' bursts and thus the portion of the light-blocking layer 204 overlying the sacrificial layer 202 delaminates from a portion of the surface of the transparent substrate 120.

Figure 18:
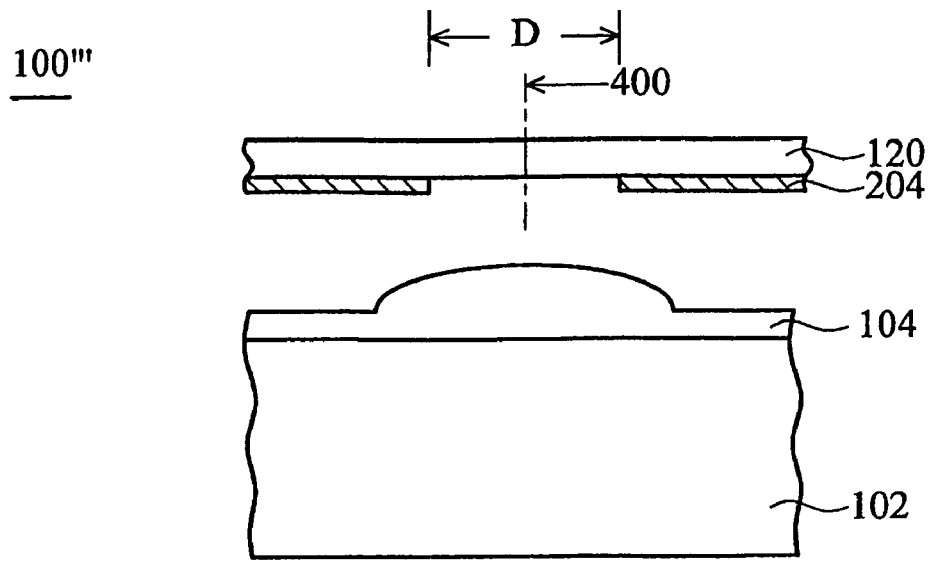

In FIGS. 16 and 17, a gas flow/scrub cleaning force 300 is next provided to clean the surface of the structure that is illustrated in FIG. 15 after the swelled sacrificial layer 202' bursts. After cleaning of the gas flow/scrub cleaning 300, a patterned light-blocking layer 204 is left over the transparent substrate 120 and exposes a portion of the surface of the transparent substrate 120 previously covered by the sacrificial layer 202, thereby forming a light-transmitting region D over the transparent substrate 120 as a diaphragm for an image sensing device and has a central axis. As shown in FIG. 18, a plurality of spacers (not shown) and the transparent substrate 120 with the light-transmitting region D thereon illustrated in FIGS. 16 and 17 can be further provided over the image sensing structure 102 with the microlens 104 formed thereon and the transparent substrate 120 can be thus structurally support by the spacers. Thus, an improved image sensing device 100''' is fabricated. As shown in FIG. 18, the central axis 400 of the light-transmitting region D over the transparent substrate 120 can be disposed to align with a central axis (not shown) of the underlying microlens 104.

Through illustration of the embodiments of the invention above, the light-transmitting region D can be formed over the transparent substrate 120 by a method rather than traditional photolithography techniques. As such, the embodiments of the invention provide a cost-effective and time-saving way for patterning a light-blocking layer 204 in the image sensing device 100''' and forming a diaphragm for the underlying image sensing elements (not shown). A relatively precise alignment between the exposed surface of the transparent substrate 120 and the diaphragm D can be also obtained.

Figure 10:
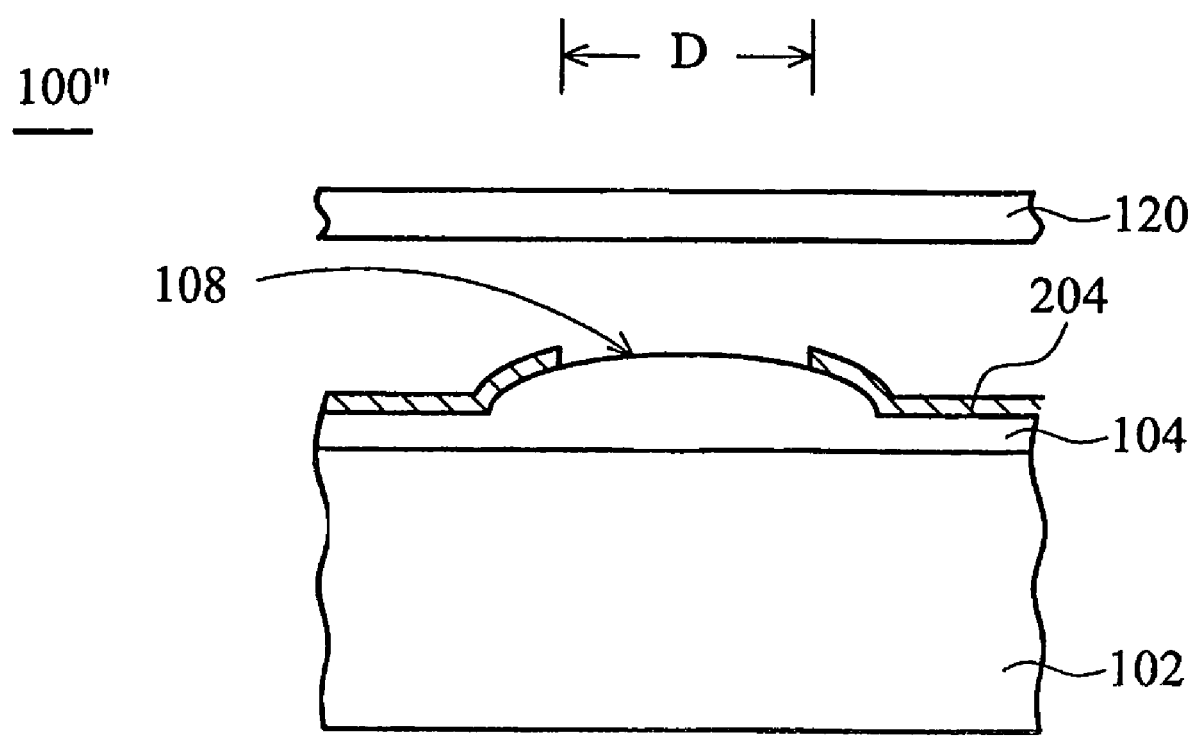
Figure 19:
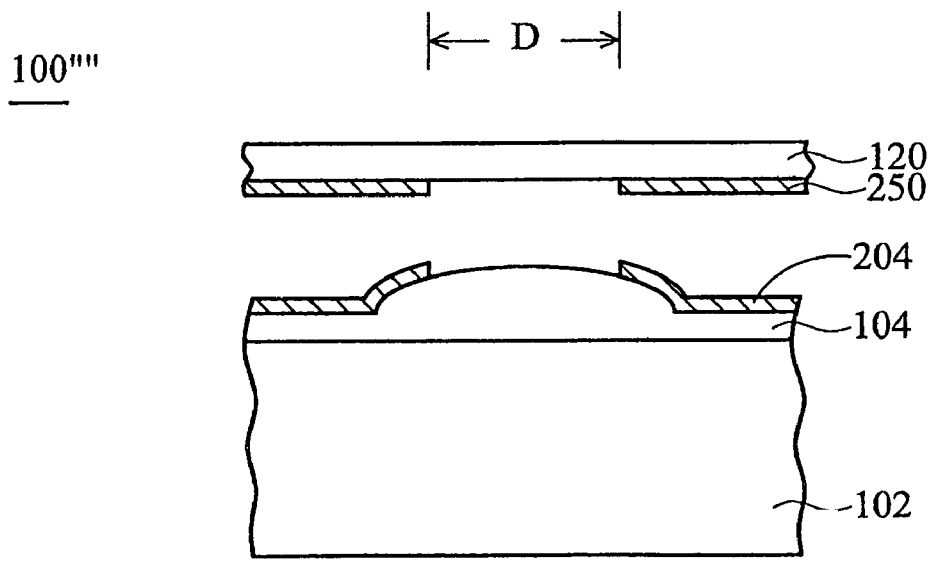
FIG. 19 is a schematic cross section showing a part of an image sensing device according to another embodiment of the invention.

FIG. 19 illustrates another image sensing device 100'''' modified from the image sensing device illustrated in FIG. 10. Similar features in the image sensing device 100'''' are not described and only differences therebetween are discussed as follows.

In FIG. 19, a diaphragm D is defined over the microlens 104 by the patterned light-blocking layer 204. A patterned electromagnetic interference (EMI) shielding layer 250 is further provided over a surface of the transparent substrate 120. It is noted that the patterned EMI shielding layer 250 has a shape substantially similar to that of the patterned light-blocking layer 204 formed over the microlens 104. The light-transmitting region in the patterned light-blocking layer 204 and the pattered EMI shielding layer 250 are substantially superimposed to define a region of the diaphragm D. In this embodiment, the EMI shielding layer 250 may comprise EMI shielding material such as metal, electronic conductor, or permeance material that provides EMI shielding effects to the image sensing element formed in the image sensing structure 102, thereby ensuring functionality of the image sensing device 100''''. Fabrication of the patterned EMI shielding layer 250 is similar to that illustrated in FIGS. 11-18 by replacing the light-blocking material with the EMI shielding material.

The embodiments of the invention for forming a light-transmitting region are illustrated as applications in forming a diaphragm and an EMI shielding layer of an image sensing device. To those skilled in the art, the above methods are also applicable in applications for forming any film layer of the image sensing device with an opening therein and to pattern the film layer. Formations of the opening is not limited to the circular opening pattern illustrated in the above embodiments, polygon opening patterns can be also achieved by the above methods and rounded corners may be provided in the polygon opening patterns.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a light-transmitting region, comprising:

providing a support feature;

forming a sacrificial layer over a portion of the support feature, wherein the sacrificial layer comprises an energy-induced swelling material;

conformably forming a light-blocking layer over the support feature, covering the sacrificial layer and the support feature;

subjecting the support feature, the sacrificial layer, and the light-blocking layer to an energy source to swell the sacrificial layer until bursting, thereby delaminating a portion of the light-blocking layer from the support feature and leaving a light-transmitting region exposed with a portion of the support feature in the light-blocking layer; and providing a gas flow or scrub cleaning force to clean up the light-transmitting region and a top surface of the light-blocking layer remaining over the support feature.

2. The method as claimed in claim 1, wherein the support feature is a transparent substrate with a planar surface.

3. The method as claimed in claim 1, wherein the support feature is a microlens with a curved portion and the sacrificial layer is formed on a part of the curved portion.

4. The method as claimed in claim 1, wherein the light-blocking layer is formed by a sputtering method.

5. The method as claimed in claim 1, wherein the energy source is a thermal energy source.

6. The method as claimed in claim 1, wherein the energy-induced swelling material is a chemical foaming agent or a physical foaming agent.

7. The method as claimed in claim 1, wherein the sacrificial layer is formed by a liquid dispenser.

8. The method as claimed in claim 1, wherein the sacrificial layer is formed with a semispherical cross section.

9. The method as claimed in claim 1, wherein the light-blocking layer comprises metal and functions as an electromagnetic interference (EMI) shielding layer.

10. The method as claimed in claim 1, wherein the light-transmitting region in the light-blocking layer functions as a diaphragm region for an image sensing device.

11. A method for forming an image sensing device, comprising:

providing an image sensing structure with a microlens, wherein the microlens is formed with a curved portion;

forming a sacrificial layer over a portion of the curved portion of the microlens, wherein the sacrificial layer comprises an energy-induced swelling material;

conformably forming a light-blocking layer over the image sensing structure, covering the sacrificial layer and the microlens;

subjecting the image sensing structure, the sacrificial layer, and the light-blocking layer to an energy source to swell the sacrificial layer until bursting, thereby delaminating a portion of the light-blocking layer from the microlens and leaving a light-transmitting region in the light-blocking layer, thereby defining a diaphragm for the microlens;

providing a gas flow or scrub cleaning force to clean up the diaphragm and a top surface of the light-blocking layer remaining over the image sensing structure; and disposing a planar substrate over the image sensing structure with the diaphragm for the microlens formed thereon, wherein the planar substrate is transparent to light.

12. The method as claimed in claim 11, wherein the light-blocking layer is formed by a sputtering method.

13. The method as claimed in claim 11, wherein the energy source is a thermal energy source.

14. The method as claimed in claim 11, wherein the energy-induced swelling material is a chemical foaming agent or a physical foaming agent.

15. The method as claimed in claim 11, wherein the sacrificial layer is formed by a liquid dispenser.

16. The method as claimed in claim 11, wherein the sacrificial layer is formed with a semispherical cross section.

17. A method for forming an image sensing device, comprising:

providing a planar substrate, wherein the planar substrate is transparent to light;

forming a sacrificial layer over a portion of the planar substrate, wherein the sacrificial layer comprises an energy-induced swelling material;

conformably forming a light-blocking layer over the planar substrate, covering the sacrificial layer and the planar substrate;

subjecting the planar substrate, the sacrificial layer, and the light-blocking layer to an energy source to swell the sacrificial layer until bursting, thereby delaminating a portion of the light-blocking layer from the planar substrate and leaving a light-transmitting region in the light-blocking layer, wherein the light-transmitting region exposes a portion of the planar substrate;

providing a gas flow or scrub cleaning force to clean up the light-transmitting region and a top surface of the light-blocking layer remaining over the transparent substrate; and disposing the planar substrate with a light-transmitting region in the light-blocking layer formed thereon over an image sensing structure with a microlens and the light-transmitting region defined as a diaphragm for the microlens.

18. The method as claimed in claim 17, wherein the light-blocking layer is formed by a sputtering method and the energy source is a thermal energy source.

19. The method as claimed in claim 17, wherein the energy-induced swelling material is a chemical foaming agent or a physical foaming agent.

20. The method as claimed in claim 17, wherein the sacrificial layer is formed by a liquid dispenser and has a semispherical cross section.

* * * * *